(12) United States Patent
Kim et al.

(10) Patent No.: US 8,197,934 B2
(45) Date of Patent: Jun. 12, 2012

(54) COMPOSITION FOR POSITIVE TYPE PHOTORESIST AND POSITIVE TYPE PHOTORESIST FILM MANUFACTURED THEREBY

(75) Inventors: Byoung-Kee Kim, Yongin-si (KR); Se-Hyung Park, Seongnam-si (KR); Bryong-Il Lee, Suwon-si (KR); Jong-Min Park, Anyang-si (KR); Seog-Jeong Song, Yongin-si (KR)

(73) Assignee: Kolon Industries, Inc., Kwacheon-Si (KR)

( * ) Notice: Subject to any disclaimer, the term of this patent is extended or adjusted under 35 U.S.C. 154(b) by 641 days.

(21) Appl. No.: 12/296,744

(22) PCT Filed: Apr. 6, 2007

(86) PCT No.: PCT/KR2007/001703
§ 371 (c)(1),
(2), (4) Date: Jan. 23, 2009

(87) PCT Pub. No.: WO2007/119949
PCT Pub. Date: Oct. 25, 2007

(65) Prior Publication Data
US 2009/0274900 A1 Nov. 5, 2009

(30) Foreign Application Priority Data

Apr. 13, 2006 (KR) .......... 10-2006-0033617
Apr. 13, 2006 (KR) .......... 10-2006-0033618
Apr. 28, 2006 (KR) .......... 10-2006-0038642
Apr. 28, 2006 (KR) .......... 10-2006-0038643

(51) Int. Cl.
*G11B 5/64* (2006.01)
*C09J 7/02* (2006.01)
(52) U.S. Cl. ............ 428/336; 428/337; 430/270.1
(58) Field of Classification Search .......... 428/336, 428/337; 430/270.1
See application file for complete search history.

(56) References Cited

U.S. PATENT DOCUMENTS

| | | | |
|---|---|---|---|
| 5,656,410 A * | 8/1997 | Van Damme et al. | 430/256 |
| 7,132,220 B2 * | 11/2006 | Arai et al. | 430/287.1 |
| 7,214,454 B2 | 5/2007 | Inomata et al. | |
| 2004/0126696 A1 | 7/2004 | Inomata et al. | |
| 2005/0042536 A1 | 2/2005 | Cho et al. | |

FOREIGN PATENT DOCUMENTS

| | | |
|---|---|---|
| EP | 0634696 A1 | 1/1995 |
| JP | 2002116536 A | 4/2002 |
| WO | 8905475 A1 | 6/1989 |

* cited by examiner

*Primary Examiner* — Terressa Boykin
(74) *Attorney, Agent, or Firm* — Sughrue Mion, PLLC

(57) ABSTRACT

Disclosed are a composition for positive type photoresist and a positive type photoresist film manufactured thereby. The composition comprises an alkali soluble resin, a photosensitive compound, a thermo-curable cross linking agent, a sensitivity enhancer and a solvent. The photoresist film has a supporting film and a photoresist layer formed on the supporting film, wherein the photoresist layer comprises the alkali soluble resin, the photosensitive compound, the thermo-curable cross linking agent and the sensitivity enhancer.

24 Claims, 1 Drawing Sheet

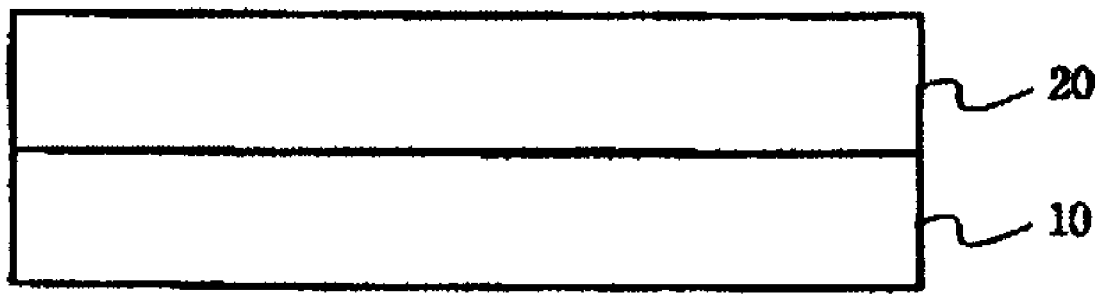

COMPOSITION FOR POSITIVE TYPE PHOTORESIST AND POSITIVE TYPE PHOTORESIST FILM MANUFACTURED THEREBY

This is a National Stage application under 35 U.S.C. §371 of PCT/KR2007/001703 filed on Apr. 6, 2007, which claims priority from Korean patent application 10-2006-0033617 filed on Apr. 13, 2006, Korean patent application 10-2006-0033618 filed on Apr. 13, 2006, Korean patent application 10-2006-0038642 filed on Apr. 28, 2006, and Korean patent application 10-2006-0038643 filed on Apr. 28, 2006, all of which are incorporated herein by reference.

TECHNICAL FIELD

The present invention relates to a composition for positive type photoresist, in particular, a composition for positive type photoresist which has excellent alkali-resistance and plating resistance so as to be appropriately employed in metal plating applications under a strong alkali condition (that is, high pH condition) such as processes for manufacturing silver electrode (hereinafter, referred to as "Ag electrode") for PDP. More particularly, the present invention relates to a composition for positive type photoresist which has excellent alkali-resistance and plating resistance as well as favorable properties including film speed, developing contrast, sensitivity, resolution, etc. and is useful for manufacturing metal electrodes.

Also, the present invention relates to a positive type photoresist film, in particular, a positive type photoresist film which has excellent alkali-resistance and plating resistance so as to be appropriately employed in metal plating applications under a strong alkali condition such as processes for manufacturing Ag electrode for PDP. More particularly, the present invention relates to a composition for positive type photoresist which has excellent alkali-resistance and plating resistance as well as favorable properties including film speed, developing contrast, sensitivity, resolution, etc. and is useful for manufacturing metal electrodes.

BACKGROUND ART

A photoresist or a photoresist film is used in the manufacture of highly integrated semiconductors such as integrated circuits (IC), printed circuit boards (PCB), and/or electronic display devices, such as cathode ray tubes (CRTs), color LCD displays or organic EL displays. And, such devices are generally manufactured by using photolithography and photofabrication techniques.

The photoresist film requires a resolution sufficient to form a pattern with extremely fine lines and small space area of not more than 7 $\mu m^2$.

The physical properties of the photoresist can be altered, such as alteration in solubility to certain solvent (that is, increase or decrease in solubility), coloration, curing and the like, via chemical modification of the molecular structure of the photoresist resin or the photoresist.

As one of conventional techniques for the formation of metal electrode, a method for manufacturing Ag electrode for PDP was featured in that a glass substrate is broadly coated with a resin composition containing silver particles dispersed therein (hereinafter, referred to as "silver paste") by means of screen printing process, then, successively subjected to pre-baking, exposing, development, drying and calcination processes to produce the final Ag electrode.

However, since the above method developed and removed undesirable portions (that is, any part except electrode formation part) after broad application of the silver paste over the glass substrate, it caused excessive loss of the silver paste and metal ingredients such as silver required for forming the electrode, leading to a problem of increase in production cost.

Further, as compared to the silver paste method requiring a high temperature sintering process, the plating method includes an etching process instead of the sintering process and can form electrode patterns in a photoresist layer of the substrate without deformation of the substrate and the patterns so that it has an advantage of preventing undercut. However, a wide variety of investigations and studies are now in progressing to solve problems in relation to adhesiveness of the plating pattern to an insulating substrate and plating resistance of the photoresist composition. In other words, the conventional composition for the photoresist had poor plating resistance and a difficulty in forming the metal electrode by means of metal plating process using a strong alkali plating solution with high pH value.

Therefore, it is an object of the present invention to solve the above problems and provide a composition for positive type photoresist which has excellent plating resistance in a metal electrode plating process under the strong alkali condition and is possibly employed in the formation of metal electrode using the metal plating process so that it can greatly reduce loss of metal ingredients such as silver during the formation of the metal electrode, thereby decreasing the production cost thereof, and is useful for forming the metal electrode on the substrate because of superior adhesiveness to the substrate.

DISCLOSURE OF INVENTION

Technical Problem

Accordingly, an object of the present invention is to provide a composition for positive type photoresist which has excellent alkali-resistance and plating resistance as well as high film speed, and favorable developing contrast, sensitivity and resolution so that it is applicable in the formation of metal electrode such as Ag electrode for PDP under the strong alkali condition by means of metal plating process.

Another object of the present invention is to provide a composition for positive type photoresist which can reduce loss of metal ingredients such as silver during the fabrication of metal electrode, leading to great decrease in production cost of the metal electrode, as well as a positive type photoresist film manufactured by the same.

Still the other object of the present invention is to provide a composition for positive type photoresist which has excellent adhesiveness to a substrate and is useful for forming a metal electrode on an insulating substrate and, in addition to a positive type photoresist film manufactured by using the composition.

Technical Means to Solve the Problem

In order to achieve the objects described above, the present invention provides a composition for positive type photoresist which comprises an alkali soluble resin, a photosensitive compound, a thermo-curable cross linking agent, a sensitivity enhancer and a solvent.

Also, the present invention provides a positive type photoresist film comprising a supporting film and a photoresist layer laminated on the supporting film, wherein the photoresist layer comprises an alkali soluble resin, a photosensitive compound, a thermo-curable cross linking agent and a sensitivity enhancer. The photoresist layer may further comprise a releasing agent.

The above description and the following embodiments are all illustrative of the present invention in order to more specifically describe the present invention as defined by the appended claims.

The objects and other aspects of the present invention will become apparent from the following examples with reference to the accompanying drawings. However, the detailed description and examples are intended to illustrate the invention as preferred embodiments of the present invention and do not limit the scope of the present invention. Accordingly, it will be understood to those skilled in the art that various modifications and variations may be made therein without departing from the scope of the present invention.

Hereinafter, the present invention will be described in detail, especially, in view of technical construction thereof.

The alkali soluble resin used in the present invention preferably includes, but is not limited to, thermo-curable novolac resin as a condensation product of phenols and aldehydes and, most preferably cresol novolac resin.

Novolac resin is obtained by polycondensation of phenols alone or in combination with aldehydes and an acidic catalyst according to known reaction mechanisms.

Phenols include, but are not limited to: primary phenols such as phenol, o-cresol, m-cresol, p-cresol, 2,3-xylenol, 2,5-xylenol, 3,4-xylenol, 3,5-xylenol, 2,3,5-trimethylphenol-xylenol, 4-t-butylphenol, 2-t-butylphenol, 3-t-butylphenol, 4-methyl-2-t-butylphenol and the like; and polyhydric phenols such as 2-naphthol, 1,3-dihydroxy naphthalene, 1,7-dihydroxy naphthalene, 1,5-dihydroxyl naphthalene, resorcinol, pyrocatechol, hydroquinone, bisphenol A, phloroglucinol, pyrogallol and the like, which may be used alone or in combination. A combination of m-cresol and p-cresol is particularly preferred.

Suitable aldehydes include, but are not limited to, formaldehyde, trioxane, paraformaldehyde, benzaldehyde, acetaldehyde, propylaldehyde, phenylacetaldehyde, α or β-phenyl propylaldehyde, o-, m- or p-hydroxybenzaldehyde, glutaraldehyde, terephthalaldehyde and the like and may be used alone or in combination.

The cresol novolac resin used in the present invention preferably has a weight average molecular weight (based on GPC) ranging from 2,000 to 30,000.

In addition, the cresol novolac resin for use in the present invention preferably has a meta/para-cresol content in a mixing ratio by weight ranging from 4:6 to 6:4, since the resin has varied physical properties such as film speed and film residual rate dependent on the mixing ratio of the meta/para-cresol content.

If the meta-cresol content among the cresol novolac resin exceeds the above range, the film speed becomes higher while the film residual rate is rapidly lowered. On the other hand, the film speed becomes unfavorably slow when the para-cresol content exceeds the above range.

Although such cresol novolac resin having a meta/para-cresol content in the mixing ratio by weight ranging from 4:6 to 6:4 can be used alone, more preferably used are resins with different molecular weights in combination. In this case, the cresol novolac resin is preferably a mixture of (i) cresol novolac resin having a weight average molecular weight (based on GPC) ranging from 8,000 to 30,000 and (ii) cresol novolac resin having a weight average molecular weight (based on GPC) ranging from 2,000 to 8,000 in a mixing ratio ranging from 7:3 to 9:1.

The term "weight average molecular weight" used herein refers to a conversion value of polystyrene equivalent determined by Gel Permeation Chromatography (GPC). If the weight average molecular weight is less than 2,000, the photoresist resin film exhibits a dramatic thickness reduction in unexposed regions after development of the film. On the other hand, when the weight average molecular weight exceeds 30,000, the development speed is lowered thereby reducing sensitivity. The novolac resin of the present invention can achieve the most preferable effects when a resin obtained after removing low molecular weight ingredients present in the reaction product has a weight average molecular weight within the range (of 2,000 to 30,000). In order to remove the low molecular weight ingredients from the novolac resin, conventional techniques known in the art including fractional precipitation, fractional dissolution, column chromatography and the like may be conveniently employed. As a result, performance of the photoresist resin film is improved, especially, scumming, thermal resistance, etc.

As the above alkali soluble resin, the novolac resin can be dissolved in an alkaline solution without increase in volume and provides images exhibiting high resistance to plasma etching when the resin is used as a mask for the etching.

The photosensitive compound as a constitutional ingredient of the present inventive composition is a diazide based photosensitive compound and, in addition, acts as a dissolution inhibitor to reduce alkali-solubility of the novolac resin. However, this compound is converted into an alkali-soluble material when light is irradiated thereon, thereby serving to increase the alkali-solubility of the novolac resin.

The diazide based photosensitive compound may be synthesized by esterification between a polyhydroxy compound and a quinonediazide sulfonic compound. The esterification for synthesizing the photosensitive compound comprises: dissolving the polyhydroxy compound and the quinonediazide sulfonic compound in a solvent such as dioxane, acetone, tetrahydrofuran, methylethylketone, N-methylpyrrolidine, chloroform, trichloroethane, trichloroethylene or dichloroethane; condensing the prepared solution by adding a basic catalyst such as sodium hydroxide, sodium carbonate, sodium hydrogen carbonate, triethylamine, N-methyl morpholine, N-methyl piperazine or 4-dimethyl aminopyridine to the solution; and successively washing, purifying and drying the resulting product. Desirable isomers can be selectively esterified and the esterification rate (average esterification rate) is not specifically limited, but is preferably in the range of 20 to 100% and more preferably 60 to 90% in terms of the esterification of the diazide sulfonic compound to OH groups of a polyhydroxy compound. When the esterification rate is too low, pattern structure and resolution are deteriorated. In contrast, deterioration of sensitivity occurs if the esterification rate is too high.

The quinonediazide sulfonic compound includes, for example, o-quinone diazide compounds such as 1,2-benzoquinone diazide-4-sulfonic acid, 1,2-naphthoquinone diazide-4-sulfonic acid, 1,2-benzoquinone diazide-5-sulfonic acid and 1,2-naphthoquinone diazide-5-sulfonic acid; and other quinone diazide sulfonic derivatives. The diazide based photosensitive compound is preferably at least one selected from a group consisting off 1,2-benzoquinone diazide-4-sulfonic chloride, 1,2-naphthoquinone diazide-4-sulfonic chloride and 1,2-naphthoquinone diazide-5-sulfonic chloride.

The quinonediazide sulfonic compound itself functions as a dissolution inhibitor to decrease the solubility of novolac resin in alkaline solutions. However, said compound is decomposed to produce alkali soluble resin during an exposing process and, thereby has a characteristic of accelerating the dissolution of novolac resin in an alkaline solution.

As the polyhydroxy compound, preferable examples are: trihydroxybenzophenones such as 2,3,4-trihydroxy benzophenone, 2,2',3-trihydroxy benzophenone, 2,3,4'-trihydroxy benzophenone; tetrahydroxybenzophenones such as 2,3,4,4-tetrahydroxybenzophenone, 2,2',4,4'-tetrahydroxybenzophenone, 2,3,4,5-tetrahydroxybenzophenone; pentahydroxy benzophenones such as 2,2',3,4,4'-pentahydroxybenzophenone, 2,2',3,4,5-pentahydroxybenzophenone; hexahydroxybenzophenones such as 2,3,3',4,4',5'-hexahydroxybenzophenone, 2,2,3,3',4,5'-hexahydroxybenzophenone; gallic alkylester; oxyflavans, etc.

The diazide based photosensitive compound for use in the present invention is preferably at least one selected from a group consisting of 2,3,4,4-tetrahydroxybenzophenone-1,2-naphthoquinonediazide-sulfonate, 2,3,4-trihydroxybenzo phenone-1,2-naphthoquinonediazide-5-sulfonate and (1-[1-(4-hydroxyphenyl)isopropyl]-4-[1,1-bis(4-hydroxyphenyl) ethyl]benzene)-1,2-naphthoquinone diazide-5-sulfonate. Also, the diazide based photosensitive compound prepared reacting polyhydroxybenzophenone and a diazide based compound such as 1,2-naphto quinonediazide, 2-diazo-1-naphthol-5-sulfonic acid may be used.

The diazide based photosensitive compound is concretely described in Chapter 7 of Light Sensitive Systems, Kosar, J.; John Wiley & Sons, New York, 1965.

Such photosensitive compounds (that is, sensitizer) used as a constitutional ingredient of the resin composition for positive type photoresist according to the present invention is selected from substituted naphthoquinone diazide based sensitizers generally employed in positive type photoresist resin compositions, which is disclosed in, for example, U.S. Pat. Nos. 2,797,213; 3,106,465; 3,148,983; 3,201,329; 3,785,825; and 3,802,885, etc.

The diazide based photosensitive compound described above is used alone or in combination in an amount of 30 to 80 parts by weight, based on 100 parts by weight of the alkali soluble resin. If less than 30 parts by weight of the diazide based photosensitive compound is used, the compound does not undergo development in a developing solution and exhibits drastically reduced residual rate of the photoresist film. In contrast, if the amount exceeds 80 parts by weight, costs are too high, thus being economically disadvantageous and, in addition, the solubility in the solvent becomes lower.

Such a diazide based photosensitive compound is capable of controlling film speed of the positive type photoresist resin film according to the present invention by procedures including, for example, the control of amount of the photosensitive compound and the control of esterification between the polyhydroxy compound such as 2,3,4-trihydroxybenzophenone and the quinonediazide sulfonic compound such as 2-diazo-1-naphthol-5-sulfonic acid.

The diazide based photosensitive compound reduces the solubility of alkali soluble resin in an aqueous alkali developing solution to about 1/100th that prior to exposure. However, after the exposure, the compound is converted into a carboxylic acid soluble in the alkaline solution, thereby exhibiting a solubility increase of about 1000 to 1500 fold, compared to non-exposed positive type photoresist compositions. The above characteristic is preferably employed in formation of micro-circuit patterns for devices such as LCDs, organic ELDs and the like. More particularly, a photoresist applied over a silicon wafer or a glass substrate is subjected to UV irradiation through a semiconductor mask in a circuit form, and then, is treated using the developing solution, resulting in a desired circuit pattern remaining on the silicon wafer or the glass substrate.

The thermo-curable cross linking agent described above comprises, for example, methoxymethylmelamine based resin and is preferably added to the composition in an amount of 10 to 30 parts by weight based on 100 parts by weight of the alkali soluble resin. If not less than 10 parts by weight of the thermo-curable cross linking agent is used, the present composition shows excellent alkali-resistance and plating resistance. Furthermore, if the amount is not more than 30 parts by weight, it undergoes more convenient developing process. As the methoxymethylmelamine based resin, more preferable example is hexamethoxymethylmelamine resin.

Since the present inventive composition contains the thermo-curable cross linking agent as proposed above, it derives cross-linking reaction of the thermo-curable cross linking agent during the formation of the metal electrode so as to considerably improve alkali-resistance and plating resistance.

The sensitivity enhancer may be used for improving sensitivity of the positive type photoresist resin film. The sensitivity enhancer comprises a polyhydroxy compound which contains 2 to 7 phenol based hydroxy groups and has a weight average molecular weight less than 1,000 relative to polystyrene. Preferred examples are at least one selected from a group consisting of 2,3,4-trihydroxybenzophenone, 2,3,4,4-tetrahydroxybenzophenone, 1-[1-(4-hydroxyphenyl)isopropyl]-4-[1,1-bis(4-hydroxyphenyl)ethyl]benzene.

The polyhydroxy compound serving as the sensitivity enhancer is preferably used in an amount of 3 to 15 parts by weight based on 100 parts by weight of the alkali soluble resin. If less than 3 parts by weight of the polyhydroxy compound is used, it exhibits insignificant photosensitizing effects and unsatisfactory resolution and sensitivity. When the amount exceeds 15 parts by weight, it exhibits high sensitivity but narrows window processing margin.

The solvent described above is preferably at least one selected from a group consisting of ethyl acetate, butyl acetate, ethyleneglycol monoethylether acetate, diethyleneglycol monoethylether acetate, propyleneglycol monoethyletheracetate, acetone, methylethyl ketone, ethyl alcohol, methyl alcohol, propyl alcohol, isopropyl alcohol, benzene, toluene, cyclopentanone, cyclohexanone, ethyleneglycol, xylene, ethyleneglycol monoethylether and diethyleneglycol monoethylether.

Amount of the solvent in the present inventive composition preferably ranges from 30 to 120 parts by weight based on 100 parts by weight of the alkali soluble resin so as to enhance coating effect achieved by the present invention.

The present composition for positive type photoresist and the photoresist layer of the positive type photoresist film formed by using the composition, may additionally contain isocyanate based compound.

Such isocyanate based compound functions to improve adhesiveness between the photoresist and a plating catalyst such as palladium Pd and is added to the composition, preferably, in an amount of 0.5 to 3 parts by weight based on 100 parts by weight of the alkali soluble resin.

It is well known that isocyanate based compounds have high reactivity and, in particular, readily react with some compounds having active hydrogen. Not to be limited to self-reaction thereof, the isocyanate based compounds also easily react with alcohol, amine, water, carboxylic acid, epoxide, etc.

Isocyanate generally has the following molecular structure formed by triple bonding thereof:

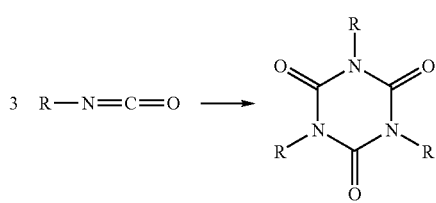

By applying the above described composition to an insulating substrate, it can stably form patterns on the substrate because the composition improves adhesive to the substrate and thermal resistance during metal plating process.

In case that the isocyanate based compound is additionally contained in the composition, the solvent used in the present invention is preferably at least one selected from a group consisting of acetone, methylethyl ketone, ethyl alcohol, methyl alcohol, propyl alcohol, isopropyl alcohol, benzene, toluene, cyclopentanone, cyclohexanone, ethyleneglycol, xylene, ethyleneglycol monoethylether and diethyleneglycol monoethylether.

Amount of the solvent preferably ranges from 190 to 250 parts by weight based on 100 parts by weight of the alkali soluble resin. If less than 190 parts by weight of the solvent is used, it is unsatisfactory to improve film formation and lamination properties of the photoresist resin layer. Within the above range, the present invention can ensure excellent coating effect.

In addition to the constitutional ingredients described above, the resin composition for positive type photoresist according to the present invention may optionally include commonly known components such as, for example, leveling agent, filler, pigment, dye, surfactant, etc. or additives.

Next, an illustrative example of processes for manufacturing Ag electrode for PDP by applying the present invention will be disclosed as follows.

First, the present resin composition is applied to a whole surface of a metal plate. The coated metal plate is successively subjected to continuous processes including pre-baking, exposing, developing and post-baking to form a photoresist layer on any region of the substrate other than a region which has a metal electrode formed thereon. Subsequently, Ag electrode is formed on the region not coated with the photoresist layer by a silver plating process. Finally, after removing the photoresist layer from the metal plate, the final Ag electrode with desired pattern was formed on the metal plate.

After then, only the Ag electrode is separated from the metal plate by means of releasing and transcription processes, resulting in the Ag electrode formed on the glass substrate.

Herein, the post-baking is carried out at 125 to 150° C. for 3 to 20 minutes to progress cross-linking reaction of the thermo-curable cross linking agent in the composition. The Ag plating process is conducted under a strong alkali condition of pH 11 to 12 in order to fulfill fine silver plating on the metal plate.

As shown in FIG. 1, a positive type photoresist resin film of the present invention comprises a supporting film 10 and a photoresist layer 20 laminated over the supporting film 10. Occasionally, in order to improve safety of storage and transportation of the positive type photoresist resin film according to the present invention, the film further includes a protective layer (not shown in drawings) over the photoresist layer 20. The photoresist layer 20 normally comprises alkali soluble resin, a photosensitive compound, a thermo-curable cross linking agent and a solvent, and optionally comprises an isocyanate based compound.

The supporting film 10 of the invention should have satisfactory physical properties for the positive type photoresist film. Examples of suitable supporting film materials include, but are not limited to, polycarbonate film, polyethylene PE film, polypropylene PP film, oriented polypropylene (OPP) film, polyethylene terephthalate (PET) film, polyethylene naphthalate (PEN) film, ethylenevinyl acetate (EVA) film, polyvinyl film, any suitable polyolefin films, epoxy film, etc. Particularly preferable polyolefin film is PP film, polyethylene (PE) film, EVA film and so on. Preferable polyvinyl film is polyvinyl chloride (PVC) film, polyvinyl acetate (PVA) film, polyvinylalcohol (PVOH) film and the like. Particularly preferable polystyrene film is polystyrene (PS) film, acrylonitrile/butadiene/styrene (ABS) film and so on. In particular, the supporting film is preferably transparent to allow light to pass through the supporting film and irradiate the photoresist resin layer.

The supporting film 10 may preferably have a thickness ranging from 10 to 50 μm, preferably 15 to 50 μm, and more preferably 15 to 25 μm, in order to function as a framework for supporting shape of the positive type photoresist resin film.

Constitutional ingredients of the photoresist layer 20 according to the present invention are substantially identical to those of the composition for the positive type photoresist described above.

Furthermore, the photoresist layer 20 of the present invention may further comprise a releasing agent to improve release properties of the supporting film after lamination, other than the above ingredients. Preferred examples of the releasing agent are silicon resin, fluorine resin, olefin resin, wax, etc. Among these, particularly preferable releasing agent is a fluorine resin with a viscosity ranging from 1,000 to 10,000 cps.

Content of the releasing agent preferably ranges from 0.5 to 4 parts by weight based on 100 parts by weight of the alkali soluble resin.

When the supporting film 10 is OPP film, the film has excellent releasing properties because of original hydrophobic property in itself. Therefore, the positive type photoresist layer does not always need to contain the releasing agent.

However, if the supporting film 10 is PET film, the film has poor releasing properties caused by original hydrophilic property in itself. Accordingly, the positive type photoresist layer should contain the releasing agent.

In addition to the above constitutional composition, generally known components such as additional components such as leveling agents, fillers, pigment, dyes, surfactants and the like and/or additives for use in conventional photoresist resin compositions may, of course, be included in the photoresist layer according to the present invention.

A process of forming the positive type photoresist layer on the supporting film comprises: coating the supporting film with a mixture of the present inventive composition and the solvent by way of generally known coating methods using a roller, roll coater, meyer rod, gravure, sprayer, etc.; and drying the coated film to volatilize the solvent. If required, the applied composition may be treated by heating and curing.

Moreover, the positive type photoresist film produced as described above may further comprise a protective layer formed on top of the positive type photoresist layer. Such a protective layer serves to block air penetration and protect the positive type photoresist resin layer from impurities or contaminants and is preferably a polyethylene film, polyethylene terephtalate film, polypropylene film, etc. and preferably has a thickness ranging from 15 to 30 μm.

Meanwhile, the process for forming patterns using the inventive photoresist resin film comprises:

(1) a step of forming the photoresist resin film, which is prepared by applying a photoresist resin layer to a supporting film, on a glass substrate and, optionally, releasing the supporting film from the photoresist resin film;

(2) a step of irradiating the prepared coating with UV irradiation through a mask or directly irradiating the prepared coating with UV irradiation not through a mask to generate a desired pattern; and (3) a step of forming a resist patterned coating which comprises removing the positive type photoresist resin coating in the UV irradiation portions by development after releasing the supporting film, in case that the supporting film was not released from the photoresist resin film.

A preferred example of the developing solution is 2.38% TMAH (Tetra-Methyl-Ammonium Hydroxide) for developing the positive type photoresist resin film according to the present invention.

In step (1), adhering the positive type photoresist resin film to the substrate positions the photoresist resin layer close to the supporting film, thereby completing formation of the positive type photoresist resin coating. The supporting film needs not be released. In addition, the photoresist resin coating formed on the substrate need not be dried.

Consequently, the desired resist patterned coating is formed through steps (1), (2) and (3).

The prepared positive type photoresist resin film comprising the photoresist resin layer on the supporting film solves problems such as reduced resolution or sensitivity during storage of the composition typically generated when using conventional liquid photoresist resin compositions, or eliminates the spin coating and/or drying processes conventionally required when applying a composition to the glass substrate, so that the present invention can solve disadvantages of thickness deviation and foaming at the drying process, improve yield and, especially, remarkably reduce processing costs.

The micro circuit pattern formed using the positive type photoresist resin film according to the present invention exhibits high resolution on the order of 2 to 7 μm, substantially similar to that of a conventional liquid positive type photoresist resin composition, and, therefore, can be employed in fabrication of micro circuits such as LCDs, organic ELDs and the like.

The process for manufacturing Ag electrode for PDP by applying the present invention will be apparent from the following description. First, the positive type photoresist film of the present invention is laminated on a glass substrate having a plating catalyst deposit formed thereon. The laminated glass substrate is successively subjected to pre-baking, exposing, developing and post-baking processes to form a photoresist layer on any region of the substrate other than a region which has a metal electrode formed thereon. The treated substrate can have Ag electrode directly formed thereon by steps of: forming a primary Ag electrode on the region not coated with the photoresist layer through an electroless Ag plating process; removing the photoresist layer from the substrate; and etching the plating catalyst deposited on the region from which the photoresist layer was released.

Herein, the post-baking step includes heating the substrate at 125 to 150° C. for 3 to 20 minutes to occur cross-linking reaction of the thermo-curable cross linking agent contained in the composition and is performed under the strong alkali condition of pH 11 to 12 to fulfill fine Ag plating on the substrate.

The above described features and other advantages of the present invention will become more apparent from the following non-restrictive examples. However, it should be understood that these examples are intended to illustrate the invention more fully as practical embodiments and do not limit the scope of the present invention.

Advantageous Effects

As described in detail above, the present invention shows excellent alkali-resistance and plating resistance as well as favorable film speed, developing contrast, sensitivity and resolution so that it can be appropriately used in the manufacture of metal electrode such as Ag electrode for PDP under a strong alkali condition by metal plating process. In addition, the present invention can reduce loss of metal ingredients such as silver required to form the metal electrode, thereby considerably reducing production cost thereof.

BRIEF DESCRIPTION OF THE DRAWINGS

The above objects and other aspects of the present invention will be apparent from the following preferred embodiments of the invention with reference to accompanying drawing in which:

FIG. 1 is a cross-sectional view illustrating a positive type photoresist film of the present invention.

BEST MODE FOR CARRYING OUT THE INVENTION

Example 1

First, a solution comprising: cresol novolac resin as an alkali soluble resin; 34 parts by weight of 1,2-naphthoquinone-2-diazide-5-sulfonic chloride as a photosensitive compound; 15 parts by weight of hexamethoxymethylmelamine as a thermo-curable cross linking agent; 3.6 parts by weight of 2,3,4-trihydroxybenzophenone as a sensitivity enhancer; and 220 parts by weight of propyleneglycol monoethylether acetate as a solvent, on the base of 100 parts by weight of the above alkali soluble resin, was prepared. The prepared solution was applied to a SUS metal plate to form a coating layer to a thickness of 3 μm and the coated plate was successively subjected to pre-baking, exposing, developing and post-baking processes to form a photoresist layer on any region of the substrate other than a region which has a metal electrode formed thereon. Subsequently, Ag electrode was formed on the region not coated with the photoresist layer by the Ag plating process. After removing the photoresist layer from the metal plate, only the Ag electrode was separated from the SUS metal plate by the releasing process and transferred to a glass substrate by the transcription process, thereby producing the final Ag electrode for PDP. Herein, the post-baking process was performed at 130° C. for 10 minutes while the Ag plating process was conducted under the strong alkali condition of pH 12. Physical properties of the produced positive type photoresist resin layer were evaluated and the results are shown in Table 2.

Examples 2 to 4 and Comparative Examples 1

Positive type photoresist resin layers and Ag electrodes were prepared in the same manner as in Example 1, except that content of hexamethoxymethylmelamine as the thermo-curable cross linking agent, temperature and working time of the post-baking process, and pH condition of the Ag plating process were varied as shown in Table 1. The results of evaluating physical properties of the produced positive type photoresist resin layers are shown in Table 2.

TABLE 1

Manufacturing condition

| Subjects | Content of hexa-methoxymethylmelamine (parts by weight) | Post-baking condition Temp. (° C.) | Time (min.) | pH at Ag plating |
|---|---|---|---|---|
| Example 1 | 15 | 130 | 10 | 12 |
| Example 2 | 10 | 130 | 10 | 11 |
| Example 3 | 20 | 130 | 5 | 12 |
| Example 4 | 30 | 120 | 10 | 11 |
| Comparative Example 1 | 0 | 150 | 10 | 11 |

TABLE 2

Results of physical properties evaluation

| Subjects | Possibility for production of Ag electrode | Physical properties of photoresist resin film Sensitivity (mJ/cm$^3$) | Resolution (μm) |
|---|---|---|---|
| Example 1 | Possible | 120 | 2.5 |
| Example 2 | Possible | 120 | 3.0 |
| Example 3 | Possible | 120 | 3.0 |
| Example 4 | Possible | 120 | 3.0 |
| Comparative Example 1 | Impossible | 120 | 3.0 |

*In the comparative example 1, since the positive type photoresist portion was released during the Ag plating process, it was nearly impossible to produce the Ag electrode. Physical properties as shown in Table 2 were evaluated by the following methods.

[Sensitivity Evaluation]

After exposing each of the produced photoresist layers which formed a coating to the thickness of 3 μm with varied amount of light, the photoresist layer was developed using 2.38% by mass of TMAH solution for 60 seconds and washed for 30 seconds then dried. Exposure amount of the resulting layer was measured using an optical microscope.

[Resolution Evaluation]

After coating a substrate with the composition (the solution) prepared as described above to the thickness of 3 μm, the coated substrate was subjected to UV irradiation using a photomask and the formed coating layer was developed using 2.38% TMAH alkali developer, resulting in a micro circuit with unexposed regions. Resolution of the produced micro circuit was observed using an electron microscope.

Example 5

A solution comprising: cresol novolac resin as the alkali soluble resin; 34 parts by weight of 1,2-naphthoquinone-2-diazide-5-sulfonic chloride as the photosensitive compound; 15 parts by weight of hexamethoxymethylmelamine as the thermo-curable cross linking agent; 219 parts by weight of methylethyl ketone as the solvent; 2 parts by weight of the isocyanate based compound; and 3.6 parts by weight of 2,3,4-trihydroxybenzophenone as the sensitivity enhancer, on the basis of 100 parts by weight of the above alkali soluble resin, was prepared. The prepared solution was applied to a glass substrate with palladium Pd deposit as the plating catalyst to a thickness of 3 μm to form a positive type photoresist layer and the treated substrate was successively subjected to pre-baking, exposing, developing and post-baking processes to form a photoresist layer on any region of the substrate other than a region which has a metal electrode formed thereon. Next, Ag electrode was formed on the region not coated with the photoresist layer by the electroless Ag plating process. After removing the photoresist layer from the glass substrate by the releasing process, the final Ag electrode for PDP was formed by etching the plating catalyst deposited on the region from which the photoresist layer was released. Herein, the post-baking process was performed at 130° C. for 10 minutes while the Ag plating process was conducted under the strong alkali condition of pH 12. Physical properties of the produced positive type photoresist resin layer were evaluated and the results are shown in Table 4.

Examples 6 to 8 and Comparative Example 2

Each of positive type photoresist resin layers and Ag electrodes was prepared in the same manner as in Example 1, except that content of hexamethoxymethylmelamine as the thermo-curable cross linking agent, temperature and working time of the post-baking process, and pH condition of the Ag plating process were varied as shown in Table 3. The results of evaluating physical properties of the produced positive type photoresist resin layers are shown in Table 4.

TABLE 3

Manufacturing condition

| Subjects | Content of hexamethoxy-methylmelamine (parts by weight) | Post-baking condition Temp. (° C.) | Time (min.) | pH at Ag plating | Content of isocyanate (parts by weight) |
|---|---|---|---|---|---|
| Example 5 | 15 | 130 | 10 | 12 | 2 |
| Example 6 | 10 | 125 | 15 | 11 | 1 |
| Example 7 | 20 | 140 | 10 | 11 | 3 |
| Example 8 | 30 | 150 | 3 | 11 | 4 |
| Comparative Example 2 | 0 | 100 | 10 | 12 | 0 |

TABLE 4

Results of physical properties evaluation

| Subjects | Possibility for production of Ag electrode | Physical properties of photoresist resin film Sensitivity (mJ/cm$^3$) | Resolution (μm) |
|---|---|---|---|
| Example 5 | Possible | 120 | 4.5 |
| Example 6 | Possible | 120 | 5.0 |
| Example 7 | Possible | 120 | 5.0 |
| Example 8 | Possible | 120 | 5.0 |
| Comparative Example 2 | Impossible | 120 | 5.0 |

*In the comparative example 2, since the positive type photoresist portion was released during the Ag plating process, it was nearly impossible to produce the Ag electrode. Physical properties as shown in Table 4 were evaluated by the same methods with those for evaluating the physical properties shown in Table 2.

Example 9

A solution comprising: cresol novolac resin as the alkali soluble resin; 34 parts by weight of 1,2-naphthoquinone-2-diazide-5-sulfonic chloride as the photosensitive compound; 15 parts by weight of hexamethoxymethylmelamine as the thermo-curable cross linking agent; 165 parts by weight of methylethyl ketone and 55 parts by weight of diethylenegylcol monoethylether acetate as the solvents; 2 parts by weight of the isocyanate based compound; 3.6 parts by weight of 2,3,4-trihydroxybenzophenone as the sensitivity enhancer; and 0.5 parts by weight of fluorine based silicon resin as a releasing agent, on the basis of 100 parts by weight of the above alkali soluble resin, was prepared. The prepared solution was subjected to filtering through a 0.2 μm millipore Teflon™ filter to remove insoluble materials. The resultant solution was applied to a PET film having a thickness of 19 μm to a thickness of 5 μm to form a positive type photoresist resin film. After laminating the formed photoresist resin film on a glass substrate with Pd deposit as the plating catalyst, the treated substrate was successively subjected to pre-baking, exposing, developing and post-baking processes to form a photoresist layer on any region of the substrate other than a region which has a metal electrode formed thereon. Next, Ag electrode was formed on the region not coated with the photoresist layer by the electroless Ag plating process. After removing the photoresist layer from the glass substrate by the releasing process, the final Ag electrode for PDP was formed by etching the plating catalyst deposited on the region from which the photoresist layer was released. Herein, the post-baking process was performed at 130° C. for 10 minutes while the Ag plating process was conducted under the strong alkali condition of pH 12. Physical properties of the produced positive type photoresist resin layer were evaluated and the results are shown in Table 6.

Examples 10 to 12 and Comparative Examples 3

Each of positive type photoresist resin layers and Ag electrodes was prepared in the same manner as in Example 1, except that content of hexamethoxymethylmelamine as the thermo-curable cross linking agent, temperature and working time of the post-baking process, and pH condition of the Ag plating process were varied as shown in Table 5. The results of evaluating physical properties of the produced positive type photoresist resin layers are shown in Table 6.

TABLE 5

Manufacturing condition

| Subjects | Content of hexamethoxy-methylmelamine (parts by weight) | Post-baking condition Temp. (° C.) | Post-baking condition Time (min.) | pH at Ag plating | Content of isocyanate (parts by weight) |
|---|---|---|---|---|---|
| Example 9 | 15 | 130 | 10 | 12 | 2 |
| Example 10 | 10 | 125 | 15 | 11 | 1 |
| Example 11 | 20 | 140 | 10 | 11 | 3 |
| Example 12 | 30 | 150 | 3 | 11 | 4 |
| Comparative Example 3 | 0 | 100 | 10 | 12 | 0 |

TABLE 6

Results of physical properties evaluation

| Subjects | Possibility for production of Ag electrode | Sensitivity (mJ/cm$^3$) | Resolution (μm) |
|---|---|---|---|
| Example 9 | Possible | 120 | 4.5 |
| Example 10 | Possible | 120 | 5.0 |
| Example 11 | Possible | 120 | 5.0 |
| Example 12 | Possible | 120 | 5.0 |
| Comparative Example 3 | Impossible | 120 | 5.0 |

*In the comparative example 3, since the positive type photoresist portion was released during the Ag plating process, it was nearly impossible to produce the Ag electrode. Physical properties as shown in Table 6 were evaluated by the following methods.

[Sensitivity Evaluation]

After exposing each of the laminated substrates with varied light amount, the substrate was developed using 2.38% by mass of TMAH solution for 60 seconds and washed for 30 seconds then dried. Exposure amount of the resulting substrate was measured using an optical microscope.

[Resolution Evaluation]

After lamination of the prepared film onto the substrate at a lamination speed of 2.0 m/min, at a temperature of 110° C. and under a heating roller pressure of 10 to 90 psi, the laminated film was subjected to UV irradiation using the photomask and release of PET film as the supporting film. Subsequently, the treated film was developed using 2.38% TMAH alkali developer, resulting in a micro circuit with unexposed regions. Resolution of the formed micro circuit was observed using the electron microscope.

Example 13

A solution comprising: cresol novolac resin as the alkali soluble resin; 34 parts by weight of 1,2-naphthoquinone-2-diazide-5-sulfonic chloride as the photosensitive compound; 15 parts by weight of hexamethoxymethylmelamine as the thermo-curable cross linking agent; 3.6 parts by weight of 2,3,4-trihydroxybenzophenone as the sensitivity enhancer; 165 parts by weight of methylethyl ketone and 55 parts by weight of diethyleneglycol monoethylether acetate as the solvents; and 0.5 parts by weight of fluorine based silicon resin as the releasing agent, on the basis of 100 parts by weight of the above alkali soluble resin, was prepared. The prepared solution was subjected to filtering through a 0.2 μm millipore Teflon™ filter to remove insoluble materials. The resultant solution was applied to a PET film having a thickness of 19 μm to a thickness of 5 μm to form a positive type photoresist resin film. After laminating the formed photoresist resin film on a SUS metal plate, the treated substrate was successively subjected to pre-baking, exposing, developing and post-baking processes to form a photoresist layer on any region of the substrate other than a region which has a metal electrode formed thereon. Next, Ag electrode was formed on the region not coated with the photoresist layer by the Ag plating process. After separating only the Ag electrode from the metal plate by the releasing process, the separated Ag electrode was transferred to a glass substrate by the transcription process to produce the final Ag electrode for PDP. Herein, the post-baking process was performed at 130° C. for 10 minutes while the Ag plating process was conducted under the strong alkali condition of pH 12. Physical properties of the produced positive type photoresist resin film were evaluated and the results are shown in Table 8.

Examples 14 to 16 and Comparative Example 4

Each of positive type photoresist resin layers and Ag electrodes was prepared in the same manner as in Example 1, except that content of hexamethoxymethylmelamine as the thermo-curable cross linking agent, temperature and working time of the post-baking process, and pH condition of the Ag plating process were varied as shown in Table 7. The results of evaluating physical properties of the produced positive type photoresist resin layers are shown in Table 8.

TABLE 7

| | Manufacturing condition | | | |
|---|---|---|---|---|
| | Content of | Post-baking condition | | pH |
| Subjects | hexamethoxymethylmelamine (parts by weight) | Temp. (° C.) | Time (min.) | at Ag plating |
| Example 13 | 15 | 130 | 10 | 12 |
| Example 14 | 10 | 125 | 15 | 11 |
| Example 15 | 20 | 140 | 10 | 12 |
| Example 16 | 30 | 150 | 3 | 11 |
| Comparative Example 4 | 0 | 150 | 10 | 11 |

TABLE 8

Results of physical properties evaluation

| | | Physical properties of photoresist resin film | |
|---|---|---|---|
| Subjects | Possibility for production of Ag electrode | Sensitivity (mJ/cm$^3$) | Resolution (μm) |
| Example 13 | Possible | 120 | 4.5 |
| Example 14 | Possible | 120 | 5.0 |
| Example 15 | Possible | 120 | 5.0 |
| Example 16 | Possible | 120 | 5.0 |
| Comparative Example 4 | Impossible | 120 | 5.0 |

*In the comparative example 4, since the positive type photoresist portion was released during the Ag plating process, it was nearly impossible to produce the Ag electrode. Physical properties as shown in Table 8 were evaluated by the same methods with those for evaluating the physical properties shown in Table 6.

INDUSTRIAL APPLICABILITY

As described above, the composition for photoresist according to the present invention has excellent plating resistance so that it can be employed in metal plating applications under strong alkali condition such as, for example, the manufacture of Ag electrode for PDP and useful to produce metal electrodes.

What is claimed is:

1. A composition for a positive type photoresist comprising:
   an alkali soluble resin,
   a photosensitive compound in an amount of 30 to 80 parts by weight based on 100 parts by weight of the alkali soluble resin,
   a thermo-curable cross linking agent in an amount of 10 to 30 parts by weight based on 100 parts by weight of the alkali soluble resin,
   a sensitivity enhancer in an amount of 3 to 15 parts by weight based on 100 parts by weight of the alkali soluble resin, and
   a solvent in an amount of 30 to 120 parts by weight based on 100 parts by weight of the alkali soluble resin,
   wherein the thermo-curable cross linking agent is a methoxymethylmelamine based resin; the alkali soluble resin is an alkali soluble cresol novolac resin; and the photosensitive compound is a diazide based compound.

2. The composition according to claim 1, wherein the sensitivity enhancer is at least one selected from a group consisting of 2,3,4-trihydroxybenzophenone, 2,3,4,4-tetrahydroxybenzophenone and 1-[1-(4-hydroxyphenyl)isopropyl]-4-[1,1-bis(4-hydroxyphenyl)ethyl]benzene.

3. The composition according to claim 1, further comprising an isocyanate based compound.

4. The composition according to claim 1, wherein the diazide based compound is at least one selected from a group consisting of: 2,3,4,4-tetrahydroxybenzophenone-1,2-naphthoquinonediazide-sulfonate; 2,3,4-trihydroxybenzophenone-1,2-naphthoquinonediazide-5-sulfonate; and (1-[1-(4-hydroxyphenyl)-isopropyl]-4-[1,1-bis(4-hydroxyphenyl)ethyl]benzene)-1,2-naphthoquinonediazide-5-sulfonate.

5. The composition according to claim 1, wherein the solvent is at least one selected from a group consisting of ethyl acetate, butyl acetate, ethyleneglycol monoethylether acetate, diethyleneglycol monoethylether acetate, propyleneglycol monoethylether acetate, acetone, methylethyl ketone, ethyl alcohol, methyl alcohol, propyl alcohol, isopropyl alcohol, benzene, toluene, cyclopentanone, cyclohexanone, ethyleneglycol, xylene, ethyleneglycol monoethylether and diethyleneglycol monoethylether.

6. The composition according to claim 1, wherein the cresol novolac resin has a weight average molecular weight (based on GPC) ranging from 2,000 to 30,000.

7. The composition according to claim 1, wherein the cresol novolac resin has a meta/para-cresol content in a mixing ratio by weight ranging from 4:6 to 6:4.

8. The composition according to claim 1, wherein the cresol novolac resin is a mixture of (i) cresol novolac resin having a weight average molecular weight (based on GPC) ranging from 8,000 to 30,000 and (ii) cresol novolac resin having a weight average molecular weight (based on GPC) ranging from 2,000 to 8,000 in a mixing ratio ranging from 7:3 to 9:1.

9. A composition for a positive type photoresist, comprising:
   an alkali soluble resin,
   a photosensitive compound in an amount of 30 to 80 parts by weight based on 100 parts by weight of the alkali soluble resin,
   a thermo-curable cross linking agent in an amount of 10 to 30 parts by weight based on 100 parts by weight of the alkali soluble resin,
   a sensitivity enhancer in an amount of 3 to 15 parts by weight based on 100 parts by weight of the alkali soluble resin,
   a solvent in an amount of 190 to 250 parts by weight based on 100 parts by weight of the alkali soluble resin, and
   an isocyanate based compound in an amount of 0.5 to 3 parts by weight based on 100 parts by weight of the alkali soluble resin,
   wherein the thermo-curable cross linking agent is a methoxymethylmelamine based resin; the alkali soluble resin is an alkali soluble cresol novolac resin; and the photosensitive compound is a diazide based compound.

10. The composition according to claim 9, wherein the solvent is at least one selected from a group consisting of acetone, methylethyl ketone, ethyl alcohol, methyl alcohol, propyl alcohol, isopropyl alcohol, benzene, toluene, cyclopentanone, cyclohexanone, ethyleneglycol, xylene, ethyleneglycol monoethylether and diethyleneglycol monoethylether.

11. A positive type photoresist film comprising: a supporting film; and a photoresist layer formed on the supporting film, wherein the photoresist layer comprises an alkali soluble resin, a photosensitive compound, a thermo-curable cross linking agent and a sensitivity enhancer, wherein the photoresist layer comprises 30 to 80 parts by weight of a diazide based photosensitive compound, 10 to 30 parts by weight of the thermo-curable cross linking agent and 3 to 15 parts by weight of the sensitivity enhancer, based on 100 parts by weight of the alkali soluble resin, wherein the thermo-curable cross linking agent is methoxymethylmelamine based resin, the alkali soluble resin is alkali soluble cresol novolac resin, and the photosensitive compound is a diazide based compound.

12. The positive type photoresist film according to claim 11, wherein the methoxymethylmelamine based resin is hexamethoxymethylmelamine resin.

13. The positive type photoresist film according to claim 11, wherein the photoresist film has a thickness of not more than 10 μm.

14. The positive type photoresist film according to claim 11, wherein the supporting film has a thickness ranging from 15 to 50 μm.

15. The positive type photoresist film according to claim 11, wherein the diazide based compound is at least one selected from a group consisting of: 2,3,4,4-tetrahydroxybenzophenone-1,2-naphthoquinonediazide-sulfonate; 2,3,4-trihydroxybenzophenone-1,2-naphthoquinonediazide-5-sulfonate; and (1-[1-(4-hydroxyphenyl)-isopropyl]-4-[1,1-bis(4-hydroxyphenyl)ethyl]benzene)-1,2-naphthoquinonediazide-5-sulfonate.

16. The positive type photoresist film according to claim 11, wherein the cresol novolac resin has a weight average molecular weight (based on GPC) ranging from 2,000 to 30,000.

17. The positive type photoresist film according to claim 11, wherein the cresol novolac resin has a meta/para-cresol content in a mixing ratio by weight ranging from 4:6 to 6:4.

18. The positive type photoresist film according to claim 11, wherein the cresol novolac resin is a mixture of (i) cresol novolac resin having a weight average molecular weight (based on GPC) ranging from 8,000 to 30,000 and (ii) cresol novolac resin having a weight average molecular weight (based on GPC) ranging from 2,000 to 8,000 in a mixing ratio ranging from 7:3 to 9:1.

19. The positive type photoresist film according to claim 11, wherein the sensitivity enhancer is at least one selected from a group consisting of: 2,3,4-trihydroxybenzophenone; 2,3,4,4-tetrahydroxybenzophenon; and 1-[1-(4-hydroxyphenyl)isopropyl]-4-[1,1-bis(4-hydroxyphenyl)ethyl]benzene.

20. The positive type photoresist film according to claim 11, wherein the supporting film is at least one selected from a group consisting of polyethylene terephthalate, polyethylene naphthalate, polycarbonate, ethylenevinyl acetate, ethylenevinyl alcohol, polyvinyl chloride, polyvinyl acetate, polyvinyl alcohol, polystyrene, acrylonitril/butadiene/styrene, epoxy, polyethylene, polypropylene and oriented polypropylene.

21. The positive type photoresist film according to claim 11, wherein the photoresist layer further contains an isocyanate based compound.

22. The positive type photoresist film according to claim 21, wherein the photoresist layer comprises 30 to 80 parts by weight of the photosensitive compound, 10 to 30 parts by weight of the thermo-curable cross linking agent, 190 to 250 parts by weight of the solvent and 0.5 to 3 parts by weight of the isocyanate based compound, based on 100 parts by weight of the alkali soluble resin.

23. The positive type photoresist film according to claim 22, wherein the photoresist layer further contains a solvent having a boiling point of not less than 100° C.

24. The positive type photoresist film according to claim 23, wherein the solvent is at least one selected from a group consisting of consisting of ethyl acetate, butyl acetate, ethyleneglycol monoethylether acetate, diethyleneglycol monoethylether acetate and propyleneglycol monoethyletheracetate.

* * * * *